(12) United States Patent
Mirpuri

(10) Patent No.: US 10,391,590 B2
(45) Date of Patent: Aug. 27, 2019

(54) HIGH TEMPERATURE SOLDER PASTE

(71) Applicant: Intel Corporation, Santa Clara, CA (US)

(72) Inventor: Kabir J. Mirpuri, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/111,593

(22) Filed: Aug. 24, 2018

(65) Prior Publication Data
US 2018/0361517 A1 Dec. 20, 2018

Related U.S. Application Data

(62) Division of application No. 15/080,365, filed on Mar. 24, 2016, now Pat. No. 10,086,479.

(51) Int. Cl.
*B23K 35/02* (2006.01)
*H01L 23/00* (2006.01)

(52) U.S. Cl.
CPC ............ *B23K 35/025* (2013.01); *H01L 24/11* (2013.01); *H01L 24/13* (2013.01); *H01L 2224/11332* (2013.01); *H01L 2224/13111* (2013.01); *H01L 2224/16227* (2013.01); *H01L 2924/014* (2013.01); *H01L 2924/3511* (2013.01)

(58) Field of Classification Search
CPC ..... H01L 2924/014; H01L 2224/13111; H01L 2924/3511; H01L 2224/11332; H01L 2224/16227; H01L 24/13; H01L 24/11; B23K 35/025
See application file for complete search history.

(56) References Cited

U.S. PATENT DOCUMENTS

| | | | |
|---|---|---|---|
| 5,064,480 | A | 11/1991 | Dershem et al. |
| 5,076,487 | A | 12/1991 | Bandyopadhyay et al. |
| 2007/0102481 | A1 | 5/2007 | Kato et al. |
| 2008/0000549 | A1 | 1/2008 | Sheng et al. |
| 2008/0053572 | A1 | 3/2008 | Sanji et al. |
| 2008/0115968 | A1 | 5/2008 | Suh et al. |
| 2011/0100690 | A1 | 5/2011 | Yoshimura et al. |
| 2013/0333807 | A1 | 12/2013 | Okada et al. |
| 2014/0084461 | A1 | 3/2014 | Sidhu et al. |

OTHER PUBLICATIONS

International Search Report and Written Opinion dated Apr. 28, 2017 for International Application No. PCT/US2017/018178, 12 pages.
Non-Final Office Action dated Mar. 1, 2017 for U.S. Appl. No. 15/080,365, 9 pages.
Final Office Action dated Aug. 4, 2017 for U.S. Appl. No. 15/080,365, 14 pages.
Non-Final Office Action dated Jan. 9, 2018 for U.S. Appl. No. 15/080,365, 7 pages.
Notice of Allowance dated Jun. 1, 2018 for U.S. Appl. No. 15/080,365, 8 pages.

*Primary Examiner* — Anthony Ho
(74) *Attorney, Agent, or Firm* — Schwabe, Williamson & Wyatt, P.C.

(57) ABSTRACT

Embodiments herein may relate to a solder paste. The solder paste may include a solder powder and a flux. In embodiments, the flux may be a non-rosin based flux. The flux may further include a thixotropic agent (TA) that may be a non-polymer based TA. Other embodiments may be described and/or claimed.

10 Claims, 6 Drawing Sheets

HIGH TEMPERATURE SOLDER PASTE

CROSS REFERENCE TO RELATED APPLICATION

This application is a divisional of U.S. patent application Ser. No. 15/080,365, entitled "HIGH TEMPERATURE SOLDER PASTE," filed on Mar. 24, 2016, and claims priority to the Ser. No. 15/080,365 application. The entire disclosure of the Ser. No. 15/080,365 application is incorporated herein by reference.

TECHNICAL FIELD

The present disclosure relates generally to the field of solder paste for high temperature printing applications, and more specifically to a water soluble solder grid array (SGA) paste.

BACKGROUND

SGA technology may be desirable for panel level processing because an SGA configuration may typically only involve printing solder paste on a strip or panel, and then performing a reflow process resulting in formation of bumps. The SGA solder paste may include a powder mixed with a flux. However, typically the incoming strips/panels may be warped at room temperature, and hence in order for the SGA bumps to be coplanar post reflow, the strips/panels may have to be flattened so that the SGA bumps are uniformly deposited across the strip/panel. One technique for doing so may include heating the strips/panels to a temperature as high as 80 degree Celsius (° C.) prior to printing the SGA bumps. This heating step may cause the strips/panels to flatten significantly such that the SGA bumps may be more uniformly deposited.

However, a consequence of pre-heating the strips/panels may be that the strips/panels are still heated when the SGA bumps are deposited, resulting in the SGA paste being exposed to significant amounts of heat prior to reflow. However, some legacy solder pastes may not be able to withstand the heating and may significantly deteriorate, which may lead to cracking or flux/powder separation of resultant post-reflow solder joints. This deterioration may increase with increasing fineness of the powder used in the solder paste to make SGA bumps with a pitch of less than 0.3 millimeters (mm).

Some legacy techniques that have been tried to address the above-described drawbacks of pre-heated SGA bumps have included a flux+microball technology. However, flux+microball may be more costly compared to SGA. Additionally, the flux used in flux+microball techniques may still need to be printed at a higher temperature, and therefore some legacy fluxes may still suffer from deterioration.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Embodiments herein may relate to a solder paste. The solder paste may include a solder powder and a flux. In embodiments, the flux may be a non-rosin based flux. The flux may further include a thixotropic agent (TA) that may be a non-polymer based TA. In some embodiments, the solder powder may be a relatively finer solder powder, as described below. In some embodiments, the flux may further include one or more of an amine, a solvent, and/or an acid. In some embodiments, the flux may generally be referred to as a water soluble (WS) flux. In some embodiments, the TA may generally be referred to as a no-clean (NC) TA. Other embodiments may be described and/or claimed.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

Figure 1:
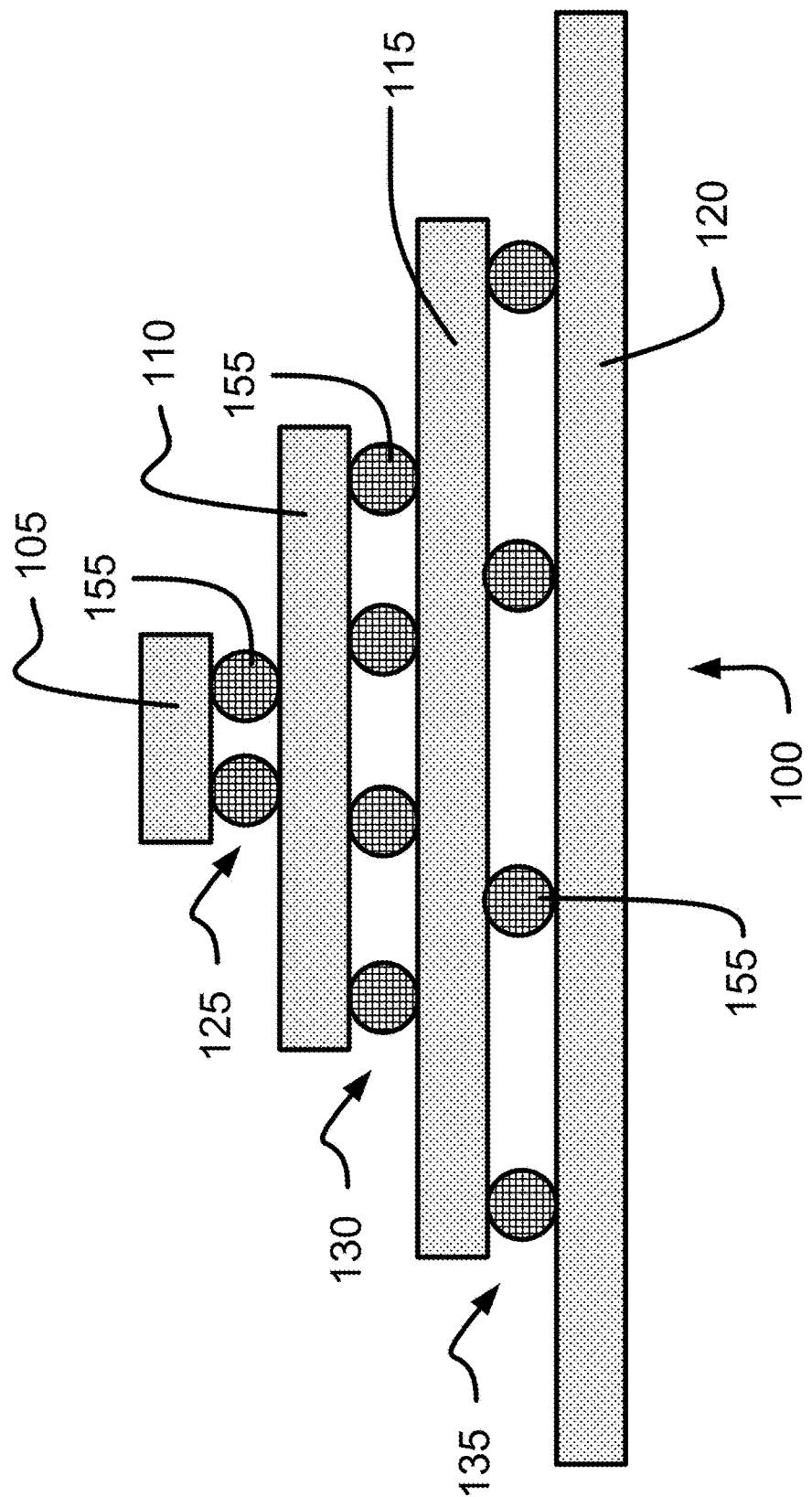
FIG. 1 depicts an example package, in accordance with various embodiments.

FIG. 1 depicts an example package 100. Specifically, a die 105 may be coupled with a patch 110 via one or more solder joints 125. The solder joints 125 may be formed of individual solder joints 155. In embodiments, the die 105 may include a central processing unit (CPU), volatile or non-volatile memory, an integrated circuit (IC) and/or some other component. In embodiments, the solder joints 125 may be or may be arranged in an SGA, as will be described in further detail below.

In embodiments, the solder joints 125 between the die 105 and the patch 110 may be collectively referred to as a first level interconnect (FLI).

Further, the patch 110 may be coupled with the interposer 115 via a plurality of solder joints 130. The solder joints 130 may be similar to, or different from, solder joints 125. Generally, the solder joints 130 between the patch 110 and the interposer 115 may be collectively referred to as a middle level interconnect (MLI). The combination of the patch 110, the solder joints 130, and the interposer 115 may be generally referred to as a PoINT architecture.

Finally, the interposer 115 may be coupled with a substrate 120 such as a printed circuit board (PCB) of a computing device via solder joints 135, which may be similar to or different than solder joints 130 or 125. The solder joints 135 may be collectively referred to as a second level interconnect (SLI). As described above, in embodiments the solder joints 125, 130, and/or 135 may be arranged in an SGA.

In embodiments, the solder joints 125 may have a relatively low pitch, that is, individual joints in the solder joints 125 may be spaced relatively close to one another. The patch 110 may serve to expand that pitch such that solder joints 130 have a relatively higher pitch than solder joints 125. Similarly, the interposer 115 may serve to further expand the pitch such that solder joints 135 have a higher pitch than solder joints 130.

It will be noted that the relative sizes and number of elements in the package 100 are depicted for the purpose of example only. Specifically, the heights or lengths of the various elements such as the die 105, solder joints 125/130/135, patch 110, interposer 115, and substrate 120 may not be to scale. Additionally, the number of elements, for example, the number of solder balls in solder joints 125, 130, and 135 may be different in different embodiments. In some embodiments, the package 100 may be missing one or both of the patch 110 or the interposer 115.

The solder joints 125, 130, and 135, and the individual solder joints 155, are described herein as joints. Generally, a joint may be the result of performing a reflow process on a solder bump in an SGA, as will be described below.

Figure 2:
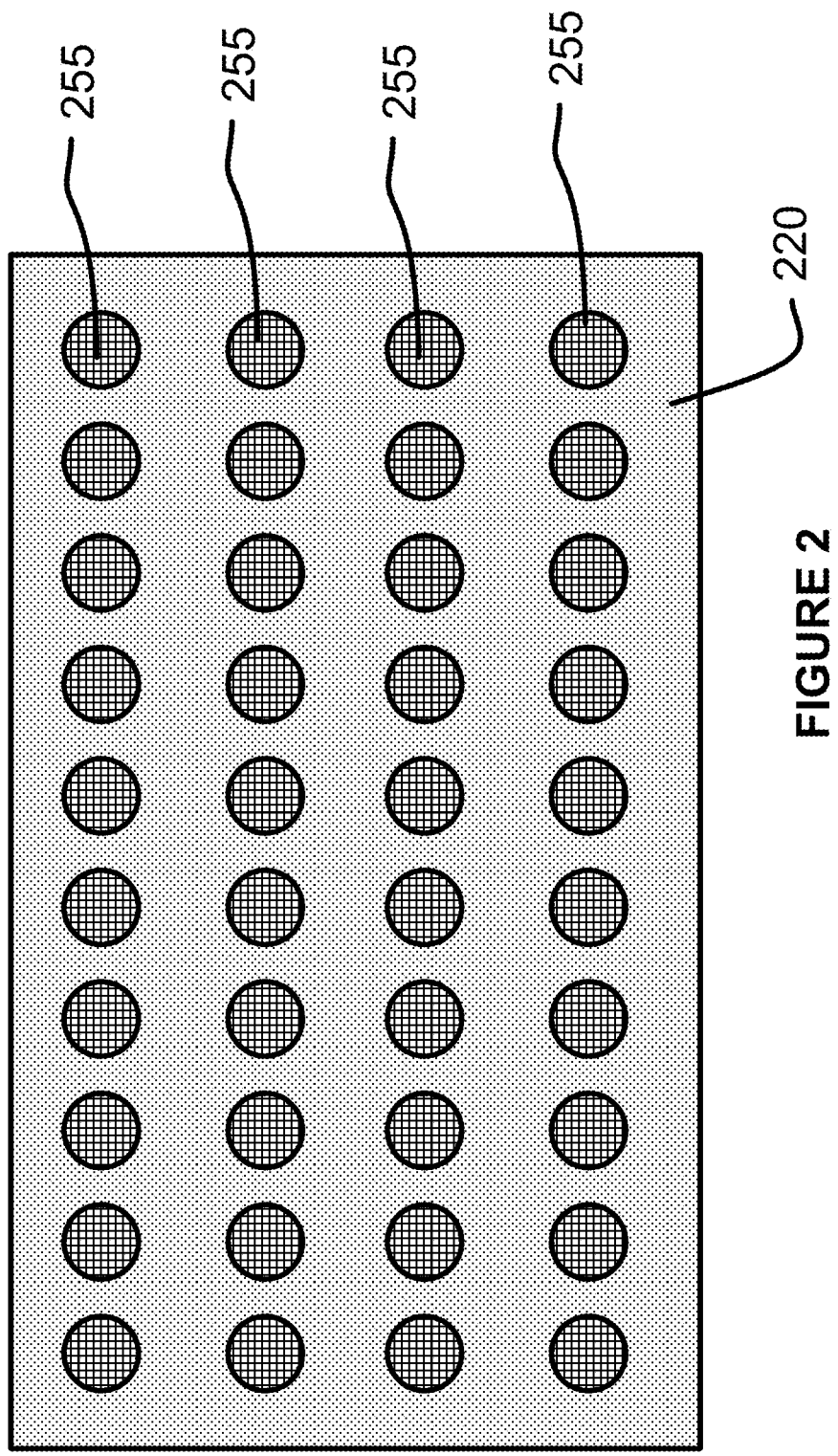
FIG. 2 depicts a top down example of an SGA, in accordance with various embodiments.

FIG. 2 depicts a top down example of an SGA, in accordance with various embodiments. The SGA may include a substrate 220, which may otherwise be referred to as a strip or a panel. In embodiments, the substrate 220 may be a cored or coreless substrate. In embodiments, the substrate 220 may be made of a material such as Ajinomoto Build-Up Film (ABF), while in other embodiments the substrate 220 may be a photo resist material or some other appropriate substrate material. The substrate may be similar to the substrates used for the die 105, the patch 110, the interposer 115, or substrate 120.

The substrate 220 may have a plurality of solder bumps 255 deposited thereon. The solder bumps 255 may be deposited via a solder paste printing process, an electrodeposition process like electroplating, or some other process like wave soldering. The solder bumps 255 may be similar, for example, to the solder bumps described with respect to FIG. 1 that are reflowed to form solder joints 125, 130, and/or 135.

Generally, the solder bumps 255 may be formed of a solder paste that includes a powder combined with a flux. The flux may include a plurality of elements such as a thixotropic agent (TA), rosins, amines, acids, and/or solvents. Specifically, the TA may serve to help bind the powder to the flux.

Generally, there are two types of flux. The first type is a WS flux. WS flux may refer to a flux that, subsequent to reflow, may be cleaned by the application of water and thereby removed from a package such as package 100. Typically, the use of a WS flux may result in a very low amount of flux residue in the package, or a lack thereof. Typically, WS fluxes may be non-rosin based and may include, for example, materials such as organic acids and amines, and a solvent. Additionally, the WS flux may include a polymer-based TA such as glycerol or some other polymer-based TA.

By contrast, a second type of flux may include an NC flux. NC flux may refer to a flux that, subsequent to reflow, is not cleaned or otherwise removed from a package such as package 100. Typically, the use of an NC flux may result in an amount of residue on the package. Such a residue may include, for example, a collar around individual solder joints or a coating on an outside surface of the solder joints. The NC flux may be rosin based, and may include, for example, materials such as gum rosin, acids, amines, and solvents. The NC flux may further include a non-polymer based TA such as castor oil, acid amides, bees wax, or some other non-polymer based TA.

Figure 3:
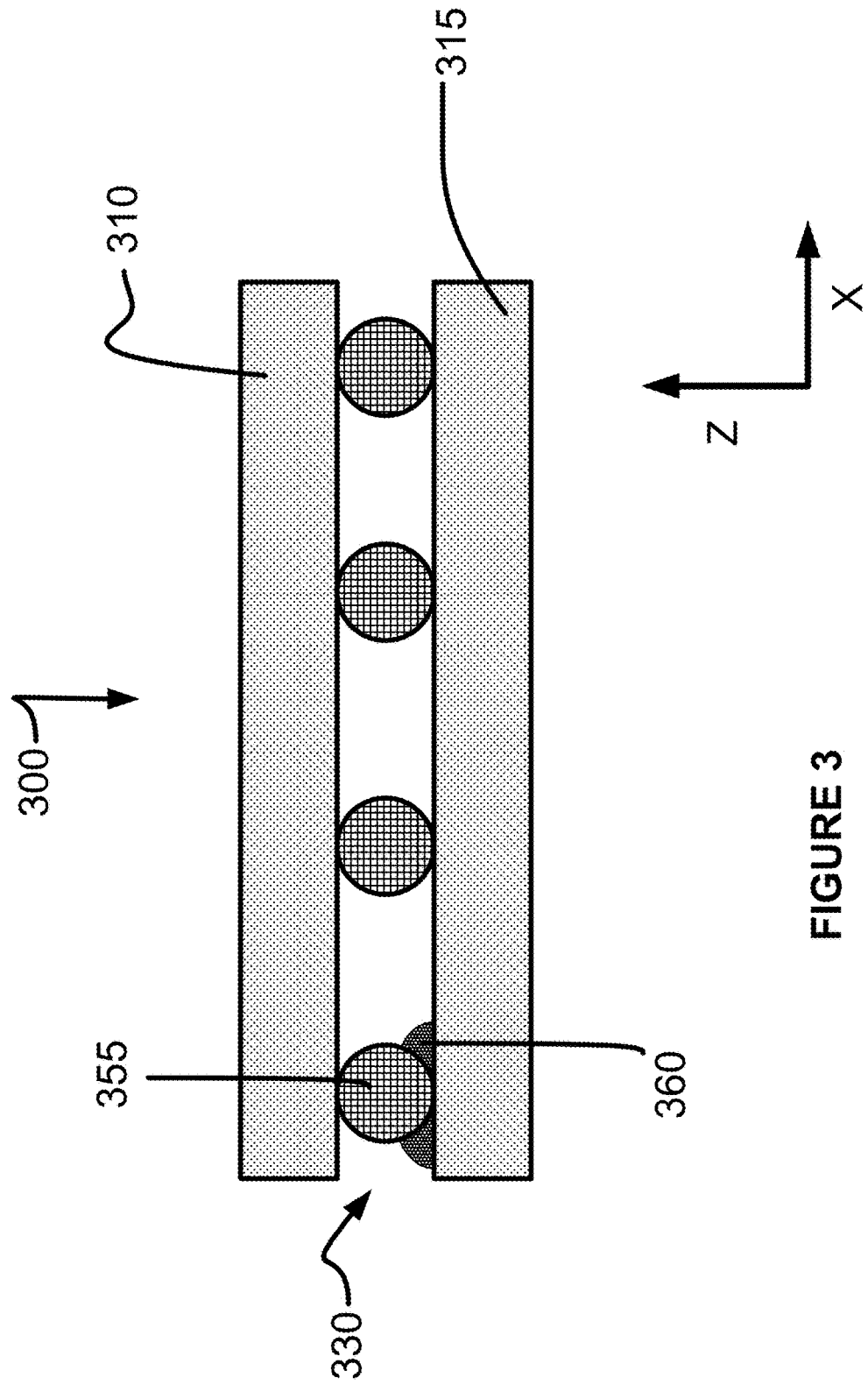
FIG. 3 depicts an example of a package that includes a plurality of solder joints with residue, in accordance with various embodiments.

FIG. 3 depicts an example of a package 300 that includes a plurality of solder joints 330 with residue, in accordance with various embodiments. The solder joints 330 may be similar to solder joints 125, 130, or 135 as described above. Specifically, the solder joints may include a solder joint that may be a reflowed solder bump. Such a solder bump, pre-reflow, may be similar to solder bump 255. The reflowed solder joint 355 may electrically, thermally, and/or physically couple two substrates 310 and 315 together. Substrates 310 and 315 may be similar to those of die 105, patch 110, interposer 115, and/or substrate 120, as described above.

When a legacy solder paste, such as that used in a solder bump similar to solder bumps 255, uses an NC flux, the flux may leave a residue during the reflow process. Such a residue may take the form of a collar such as collar 360. The collar may have a height (that is, distance along the Z axis) of a few microns. The collar 360 may also have a spread (measured along the X axis) of a few microns. In some embodiments, the residue may also take the form of a coating on the surface of the solder joint 355. The residue may coat anywhere from 1% to 100% of the surface of the solder joint 355.

In embodiments, the solder bumps 255 may be deposited on the substrate in an SGA configuration. SGA may refer to a configuration wherein the solder bumps 255 are deposited directly onto the substrate 220, and then a reflow process is performed. In other words, in SGA, no solder balls may be used such as those that are commonly used in ball grid array (BGA) configurations.

A reflow process may include, for example, coupling a component or another board with the solder bumps 255 and then heating the bumps 255, the substrate 220, and the additional component/board. When the bumps 255 are heated, the solder may melt and then subsequently solidify, thereby physically, electrically, and/or thermally coupling the substrate 220 to the additional component/board by solder joints such as joints 125, 130, and/or 135.

SGA technology may include multiple advantages over alternative configurations such as BGA configurations. Specifically, SGA technology may have a relatively lower cost, a reduced z-height, less yield loss due to zero ball-placement, a lower runtime (for example, because no balls are being placed), and/or other advantages.

However, as noted above, in some cases the substrate 220 may be warped prior to printing the bumps 255. For example, in some cases the warpage of the substrate 220 may be as high as 100-500 microns. Such warpage may make uniform printing of the bumps 255 difficult, resulting in possible yield loss of a package such as package 100 that uses solder joints that result from such bumps 255. However, the warpage may decrease with increasing temperature and, at temperatures around 80-100° C., the warpage may drop to a level manageable enough for the SGA process. Therefore, in order to attain usable coplanarity, it may be desirable to print the bumps 255 on the substrate 220 once the substrate is heated to a relatively high temperature.

The bumps 255 may therefore need to be able to withstand the relatively high temperature of the substrate 220. In legacy packages, solder paste using a WS flux may typically be used for the bumps 255. However, the WS flux may not be able to withstand the relatively high temperatures as described above, and may suffer from slumping and/or flux/powder separation. Although NC flux may be able to withstand the higher temperatures, WS flux may typically be more desirable for use in packages because of the higher activity of the WS flux and relatively simple composition of the WS flux relative to NC flux or systems.

Therefore, legacy formulations of WS flux may not be used directly for printing of SGA bumps 255 onto the pre-heated substrate 220, because doing so may trigger the above-described flux/powder separation, and lead to a rise in viscosity of the solder paste, which may hamper the printing capability of the paste.

Embodiments herein may rely on a solder paste or flux that may withstand the relatively high temperatures of the pre-heated substrate. Specifically, embodiments herein may use a paste and a flux that has at least 4 hours of sustainability at a temperature of 80° C. Besides high temperature sustainability, the underlying solder flux used in the solder paste must be able to form successful joints with relatively finer solder powder. Such relatively finer solder powder may be suitable for use in packages with pitches of approximately 0.3 mm, and solder resist openings (SROs) of between approximately 100 to approximately 200 microns. In some other cases the SRO may be larger or smaller than the specified dimensions. Such a solder powder may be composed of Tin (Sn), Silver (Ag), and Copper (Cu), which may be referred to as SAC, a Tin-Copper compound (SnCu), a Tin-Bismuth compound (SnBi), or some other metallurgical composition where the size of the powder particles can vary from approximately 3 to approximately 100 microns in diameter.

Such a solder paste may include a typically WS flux that uses an NC TA, as described above. Specifically, the flux may include a solvent, acid, and amine of a WS flux, and an NC TA. In embodiments, the flux may be described as a non-rosin based flux that uses a non-polymer based TA, as described above. The solder paste may include the described flux coupled with the above described relatively finer solder powder that may be suitable for use in packages with pitches of approximately 0.3 mm, and/or SROs of between approximately 100 to approximately 200 microns. In some other cases the SRO may be larger or smaller than the specified dimensions.

In embodiments, the non-polymer based TA may have a melting point of approximately 120° C. or greater. In some cases, the non-polymer based TA may have a melting point of approximately 145-155° C.

In various embodiments, the non-rosin based flux with the non-polymer based TA may be used to form one or more of solder joints 125, 130, and/or 135. Additionally, the non-rosin based flux with the non-polymer based TA may be used to print solder bumps 255 on heated substrate 220. The resultant solder joints, similar to solder joints 355, may have a collar (similar to collar 360) of less than 1 micron in height or width, as described above with respect to FIG. 3.

Such a formulation of a solder paste using the relatively finer solder powder and the non-rosin based flux with the non-polymer based TA may allow the solder bumps 255 to be printed on the heated substrate 220 without suffering from any of the negative consequences described above. In embodiments, the solder paste with the non-rosin based flux that uses the non-polymer based TA may successfully sustain a continuous knead at approximately 60° C. for approximately 10 hours. In some embodiments, the solder paste with the non-rosin based flux that uses the non-polymer based TA may sustain a temperature of between 80° C. for approximately 6 hours. In some embodiments, the solder paste with the non-rosin based flux that uses the non-polymer based TA may sustain a temperature of approximately 100° C. for approximately 10 minutes. As used herein, "sustaining" a temperature may refer to stability without any chemical degradation.

Figure 4:
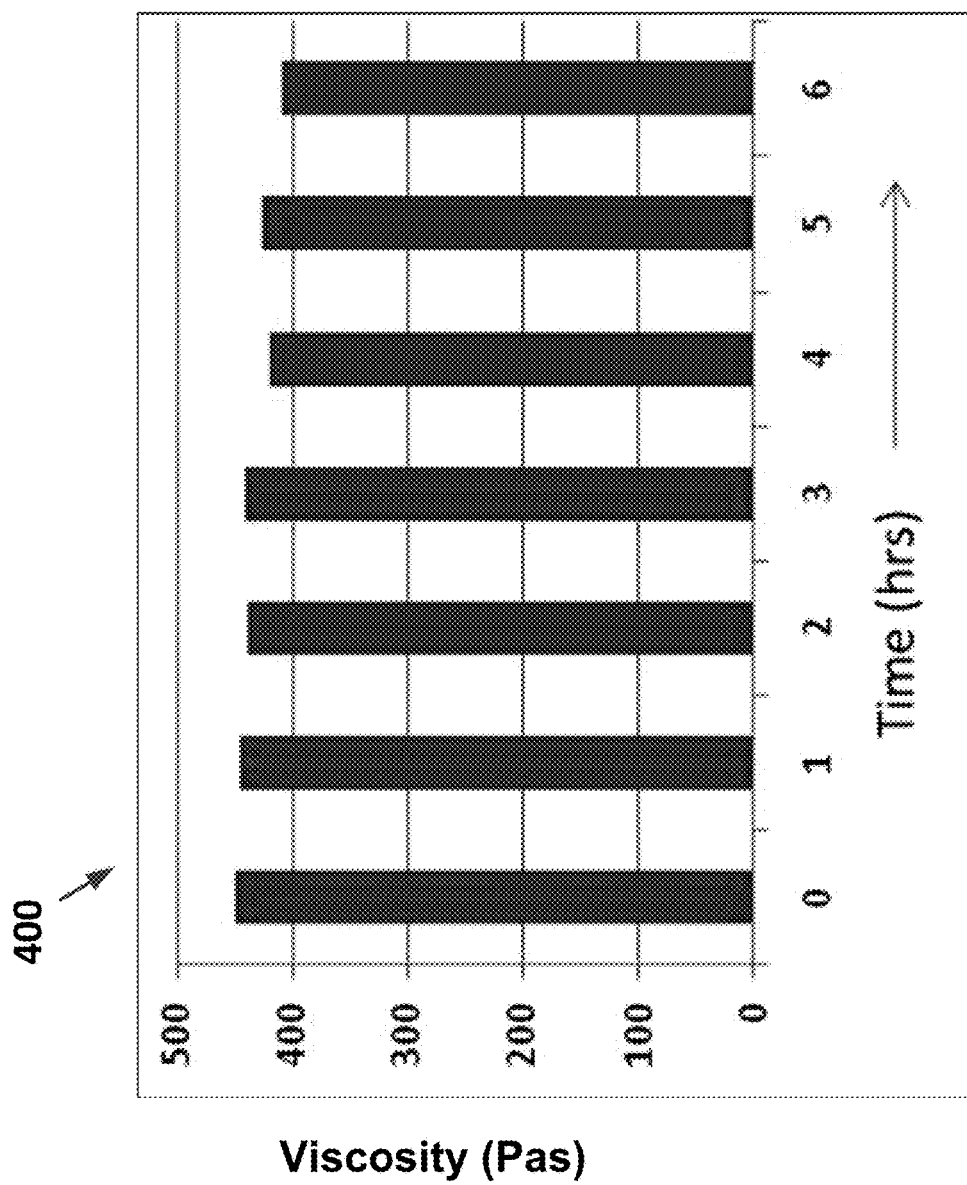
FIG. 4 depicts an example of viscosity over time for a solder paste that uses a water soluble (WS) flux with an NC TA, in accordance with various embodiments.

FIG. 4 depicts an example 400 of viscosity a solder paste that uses a non-rosin based flux with a non-polymer based TA when the solder paste is exposed to a sustained temperature of approximately 80° C. The X axis depicts time in hours, and the Y axis depicts viscosity in units of a Pascal-Second (Pas). As can be seen, the solder paste may maintain a relatively high viscosity (at or above 400 Pas) over at least 6 hours.

Figure 5:
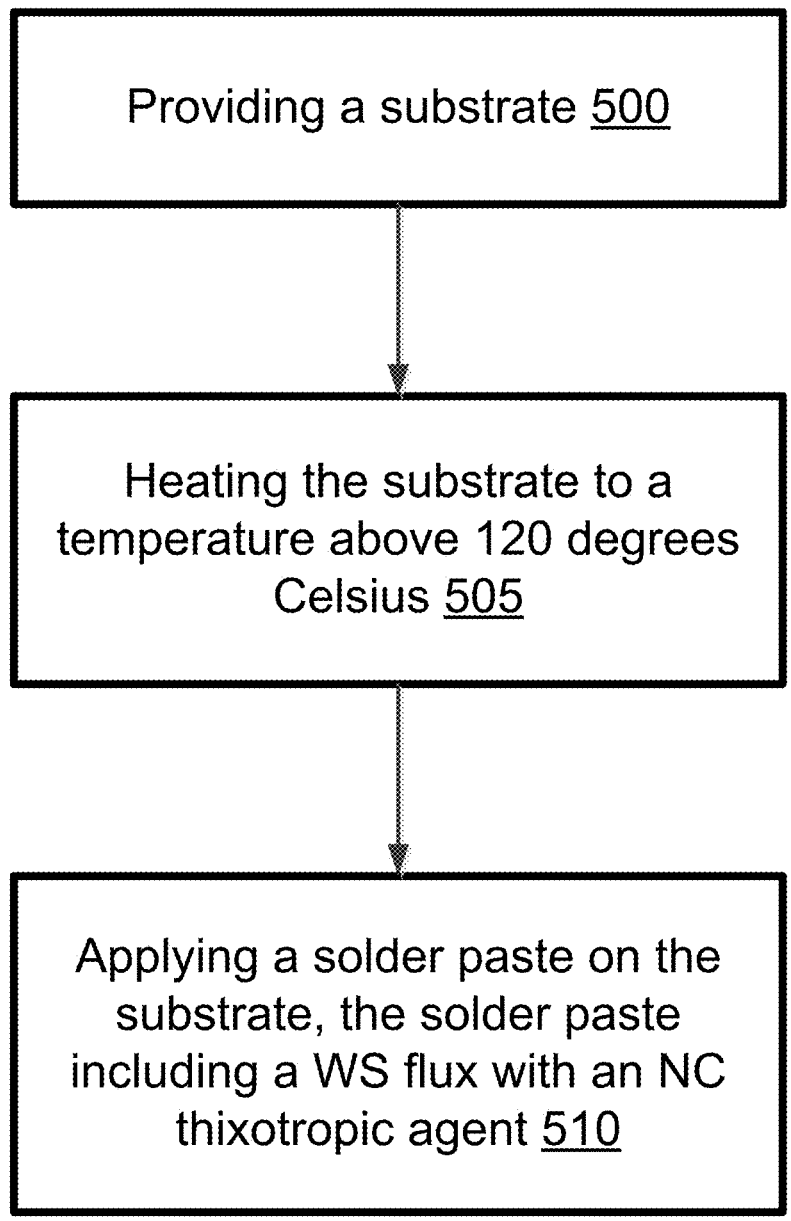
FIG. 5 depicts an example of a process for manufacturing a package using a solder paste that uses a WS flux with an NC TA, in accordance with various embodiments.

FIG. 5 depicts an example process for generating a package such as the packages 100 or 300. Initially, a substrate may be provided at 500. Such a substrate may be similar, for example, to die 105, patch 110, interposer 115, and/or substrates 220, and/or 315. The substrate may then be heated at 505. As described above, the substrate may be heated to a temperature of above approximately 120° C. to flatten the substrate such that even printing of SGA bumps may be performed. In other embodiments, the substrate may be heated more or less, dependent on how warped the substrate is, what material the substrate is made of, the coplanarity requirements of the SGA bumps on the substrate, or other considerations.

Subsequent to heating (and optionally flattening) the substrate at 505, the solder paste may be applied to the substrate at 510. Specifically, the solder paste may be applied in an SGA configuration of solder bumps such as bumps 255. The solder paste may include a WS (i.e., a non-rosin based) flux with an NC (i.e., non-polymer based) TA. In some embodiments, the solder paste may further include the relatively finer solder powder described above.

Figure 6:
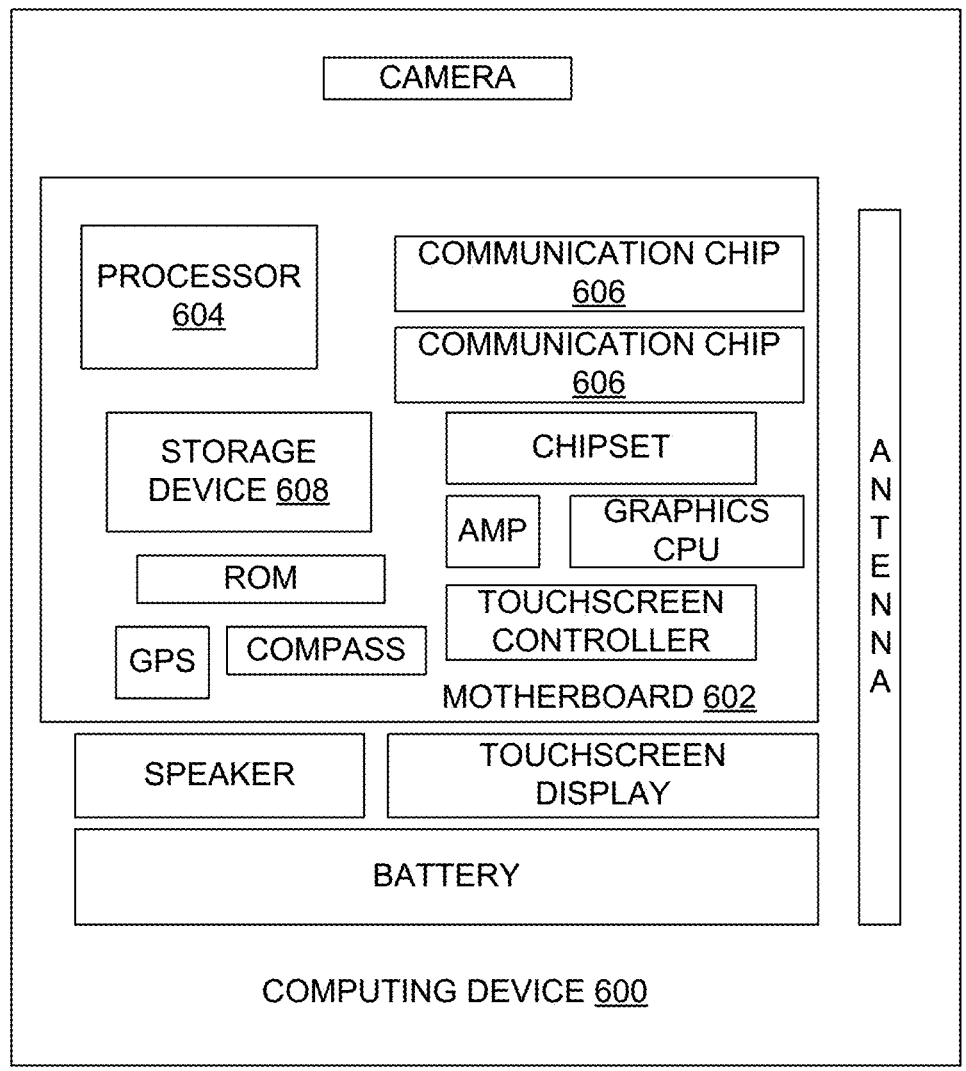
FIG. 6 is an example computing device that may include the solder paste that uses a WS flux with an NC TA, in accordance with various embodiments.

Embodiments of the present disclosure may be implemented into a system using any patches, interposers, die, substrates, and/or packages that may benefit from the SGA grid and WS flux with an NC TA as described herein. FIG. 6 schematically illustrates a computing device 600, in accordance with some implementations, which may include one or more packages such as packages 100 or 300 that use the WS flux with the NC TA as described herein.

The computing device 600 may be, for example, a mobile communication device or a desktop or rack-based computing device. The computing device 600 may house a board such as a motherboard 602. In embodiments, the motherboard 602 may be similar to substrate 120. The motherboard 602 may include a number of components, including (but not limited to) a processor 604 and at least one communication chip 606. In further implementations, the communication chip 606 may be part of the processor 604. In some embodiments, one or more of the components such as the processor 604 may be coupled with a patch such as patch 110 or an interposer such as interposer 115, which may in turn be coupled with the motherboard 602. That is, in some embodiments the processor 604 may be similar to the die 105. In other embodiments, the communication chip 606 or some other element of the computing device 600 may additionally or alternatively be coupled with the patch 110 or the interposer 115.

The computing device 600 may include a storage device 608. In some embodiments, the storage device 608 may include one or more solid state drives. Examples of storage devices that may be included in the storage device 608 include volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

Depending on its applications, the computing device 600 may include other components that may or may not be physically and electrically coupled to the motherboard 602. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

The communication chip 606 and the antenna may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wide region (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, EV-DO, and others. In some embodiments, the communication chip 606 may support wired communications. For example, the computing device 600 may include one or more wired servers.

The processor 604 and/or the communication chip 606 of the computing device 600 may be or include one or more dies or other components in an IC package. Such an IC package may be directly or indirectly coupled with a patch, an interposer and/or a motherboard 602 using any of the techniques disclosed herein. The term "processor" may refer to any device or portion of a device that processes electronic data from registers and/or memory to transform that electronic data into other electronic data that may be stored in registers and/or memory.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data. In some embodiments, the recessed conductive contacts disclosed herein may be implemented in a high-performance computing device.

The following paragraphs provide examples of various ones of the embodiments disclosed herein.

Example 1 may include a solder paste comprising: powder particles; and a non-rosin based flux that includes a non-polymer based thixotropic agent.

Example 2 may include the solder paste of example 1, wherein the non-rosin based flux further comprises a solvent, an acid, and an amine.

Example 3 may include the solder paste of example 2, wherein the acid is an organic acid and the amine is an organic amine.

Example 4 may include the solder paste of any of examples 1-3, wherein the powder particles include Tin-Silver-Copper (SAC), a Tin-Copper compound (SnCu), or a Tin-Bismuth compound (SnBi).

Example 5 may include the solder paste of any of examples 1-3, wherein the non-polymer based thixotropic agent includes castor oil, acid amides, or bees wax.

Example 6 may include the solder paste of any of examples 1-3, wherein the thixotropic agent adheres the particles to the non-rosin based flux.

Example 7 may include the solder paste of any of examples 1-3, wherein the thixotropic agent has a melting point above 120 degrees Celsius.

Example 8 may include the solder paste of any of examples 1-3, wherein the non-rosin based flux is water soluble.

Example 9 may include the solder paste of any of examples 1-3, wherein the non-polymer based thixotropic agent is water insoluble.

Example 10 may include the solder paste of any of examples 1-3, wherein the thixotropic agent leaves a residue collar of around one micron or less in height and diameter around a reflowed solder ball.

Example 11 may include a method comprising: providing a substrate; heating the substrate to a temperature above 120 degrees Celsius; and applying a solder paste on the substrate, the solder paste including a water soluble flux with a non-polymer based thixotropic agent.

Example 12 may include the method of example 11, wherein the water soluble flux includes a solvent, an organic acid, and an organic amine.

Example 13 may include the method of examples 11 or 12, wherein the non-polymer based thixotropic agent includes castor oil, acid amides, or bees wax.

Example 14 may include the method of examples 11 or 12, wherein the water soluble flux is non-rosin based.

Example 15 may include the method of examples 11 or 12, wherein the non-polymer based thixotropic agent is water insoluble.

Example 16 may include a package comprising: a substrate; and a component coupled with the package via a plurality of solder bumps in a solder grid array (SGA); wherein a surface of the solder bumps includes approximately 1% or less of a thixotropic agent.

Example 17 may include the package of example 16, wherein the component includes a die.

Example 18 may include the package of example 16, wherein the thixotropic agent is non-polymer based.

Example 19 may include the package of example 18, wherein the non-polymer based thixotropic agent includes castor oil, acid amides, or bees wax.

Example 20 may include the package of any of examples 16-19, wherein the thixotropic agent has a melting point around 150 degrees Celsius.

What is claimed is:

1. A package comprising:
    a substrate;
    a component coupled with the package via a plurality of solder bumps in a solder grid array (SGA); and
    wherein a surface of the solder bumps includes approximately 1% or less of a thixotropic agent.

2. The package of claim 1, wherein the component includes a die.

3. The package of claim 1, wherein the thixotropic agent is non-polymer based.

4. The package of claim 3, wherein the non-polymer based thixotropic agent includes castor oil, acid amides, or bees wax.

5. The package of claim 1, wherein the thixotropic agent has a melting point around 150 degrees Celsius.

6. The package of claim 1, wherein the thixotropic agent has a melting point above 120 degrees Celsius.

7. The package of claim 1, wherein the thixotropic agent adheres particles to a non-rosin based flux.

8. The package of claim 7, wherein the non-rosin based flux is water soluble.

9. The package of claim 3, wherein the non-polymer based thixotropic agent is water insoluble.

10. The package of claim 1, wherein the thixotropic agent leaves a residue collar of around one micron or less in height and diameter around a reflowed solder ball.

* * * * *